United States Patent [19]

Barton et al.

[11] Patent Number: 5,217,947
[45] Date of Patent: Jun. 8, 1993

[54] HIGH-TEMPERATURE SUPERCONDUCTORS

[75] Inventors: Roger W. Barton, Menlo Park; Ann F. Marshall, Mountain View; Kookrin Char; Aharon Kapitulnik, both of Palo Alto; Stephen S. Laderman, Menlo Park, all of Calif.; Mark Lee, Chatham, N.J.; Robert Hammond, Los Altos, Calif.

[73] Assignee: The Board of Trustees of the Leland Stanford Junior University, Stanford, Calif.

[21] Appl. No.: 728,799

[22] Filed: Jul. 10, 1991

Related U.S. Application Data

[63] Continuation of Ser. No. 311,627, Feb. 16, 1989, abandoned.

[51] Int. Cl.[5] .............................................. C01B 13/14
[52] U.S. Cl. ........................................ 505/1; 505/779; 501/123; 501/126; 423/596; 423/604
[58] Field of Search ............... 505/785, 781, 779, 778, 505/776, 1, 780, 742; 501/123, 126, 152; 423/596, 604

[56] References Cited

U.S. PATENT DOCUMENTS

| 4,866,031 | 9/1989 | Bolt et al. | 501/152 |
| 4,918,051 | 4/1990 | Mantese et al. | 505/1 |
| 5,024,992 | 6/1991 | Morris | 505/1 |

FOREIGN PATENT DOCUMENTS

WO88/05029  7/1988  PCT Int'l Appl.

OTHER PUBLICATIONS

*Nature*, "Synthesis of Bulk Superconducting $\gamma Ba_2Cu_4O_8$ at one atmosphere oxygen pressure" Cava et al pp. 328–330, vol. 338.
"Five New Superconductors with the 2-4-7 Structure" Morris et al Smithsonian Institution (Preprint).
*Nature*/"Letters to Nature" Structure Determination of the New High Temperature Superconductor $\gamma_2Ba_4Cu_7O_{14+x}$ Bordet et al, vol. 334, No. 18, pp. 596–598.
*Physical Review: Brief Reports* "Superconducting Properties of a 27Å phase of Ba-Y-Cu-O" Mandich et al, vol. 38, No. 7, pp. 5031–5034. Sep. 1, 1988.
*Nature*/"Letters to Nature" Crystal Structure of the 80 K Superconductor $\gamma Ba_2Cu_4O_8$ Marsh et al, vol. 334, No. 14 (Jul. 14, 1988).
Chem Abstracts; "Superconductivity Studies of the high Tc phases in the yttrium barium copper oxide system" Rao et al (1987).
"Bulk Synthesis and Thermodynamic Stability of the 1-2-4 and 2-4-7 Superconductors at oxygen Partial Pressure between 10 and 100 atm." Morris et al, Jan. 29, 1989 (Preprint).
"Crystal Structure of $DyBa_2Cu_4O_8$: A New 77 K bulk superconductor" Hazen et al, *Applied Phys. Lett*, 54(11) [Mar. 13, 1989] pp. 1057–1059.
*Physical Review B:* "Properties of Y-Ba-Cu-O Thin Films with ordered defect structure: $Y_2Ba_4Cu_8O_{20-x}$" Char et al, vol. 38, No. 1, pp. 834–837.

(List continued on next page.)

*Primary Examiner*—Mark L. Bell
*Assistant Examiner*—Paul Marcantoni
*Attorney, Agent, or Firm*—Flehr, Hohbach, Test, Albritton & Herbert

[57] ABSTRACT

Novel superconducting oxide compositions of the formulas $(YBa_2Cu_{3.25})_nO_z$ and $Y_2Ba_4Cu_8O_{20-x}$ (248) are provided which can have an ordered defect structure faulted 248 structure with a 123 structure ($YBa_2Cu_3O_{7-y}$) are also provided. The faulted and unfaulted 248 structures are advantageous over the 123 structures in that oxygen in the 248 structure is more stable consistent with a locked-in structure; the 248 structures are not twinned and therefore have improved current-carrying capacity; there is better conductivity in the non-superconducting (metal) state than 123; and they are less anisotropic than the 123 structures.

49 Claims, 5 Drawing Sheets

OTHER PUBLICATIONS

*Physical Review B:* "Ordered Defect Structure in Epitaxial $YBa_2Cu_3O_{7-x}$ Thin films" Marshall et al, vol. 37, No. 16, [Jun. 1988] pp.9353–9358.

*Physical Review:* vol. 39, No. 10 "Eight new high temperature superconductors with 1:2:4 structure" Morris et al [Apr. 1989].

*Physica C* 159 (1989) pp. 287–294 "Stability of 124, 123 and 247 Superconductors" Morris et al.

"Observation of a halide (F/Cl) stabilized new Perovskite phase in superconducting $Y_2Ba_5Cu_7O_x$ films" Applied Phys. Lett. 52 (19) May 9, 1988 pp. 1625–1627 Kwo et al.

Russian Article: "High Temperature Superconductivity in the $Y_{Ba2}Cu_xO_{4-x+d}$ System" Olekhnovich et al. pp. 1–8 (1987).

*Nature/*"Letters to Nature" Bulk Synthesis of the 81 K superconductor $YBa_2Cu_4O_8$ at high oxygen pressure Karpinski et al, vol. 336, No. 15, Dec. 1988, pp. 660–662.

Marshall, et al., Physical Review B, 37, (16) 9353–9358 (Jun. 1, 1988).

Char, et al., Physical Review B, 38(1) 834–837 (Jul. 1, 1988).

Müller, et al., Science, 237, 1133–1139 (Sep. 1987).

Bagani, Chemical and Engineering News, 24–29 (May 16, 1988).

Wu, et al., Physical Review of Letters, 58,(9) 908–910 (Mar. 2, 1987).

Chemical & Engineering News, 24 (Nov. 30, 1987).

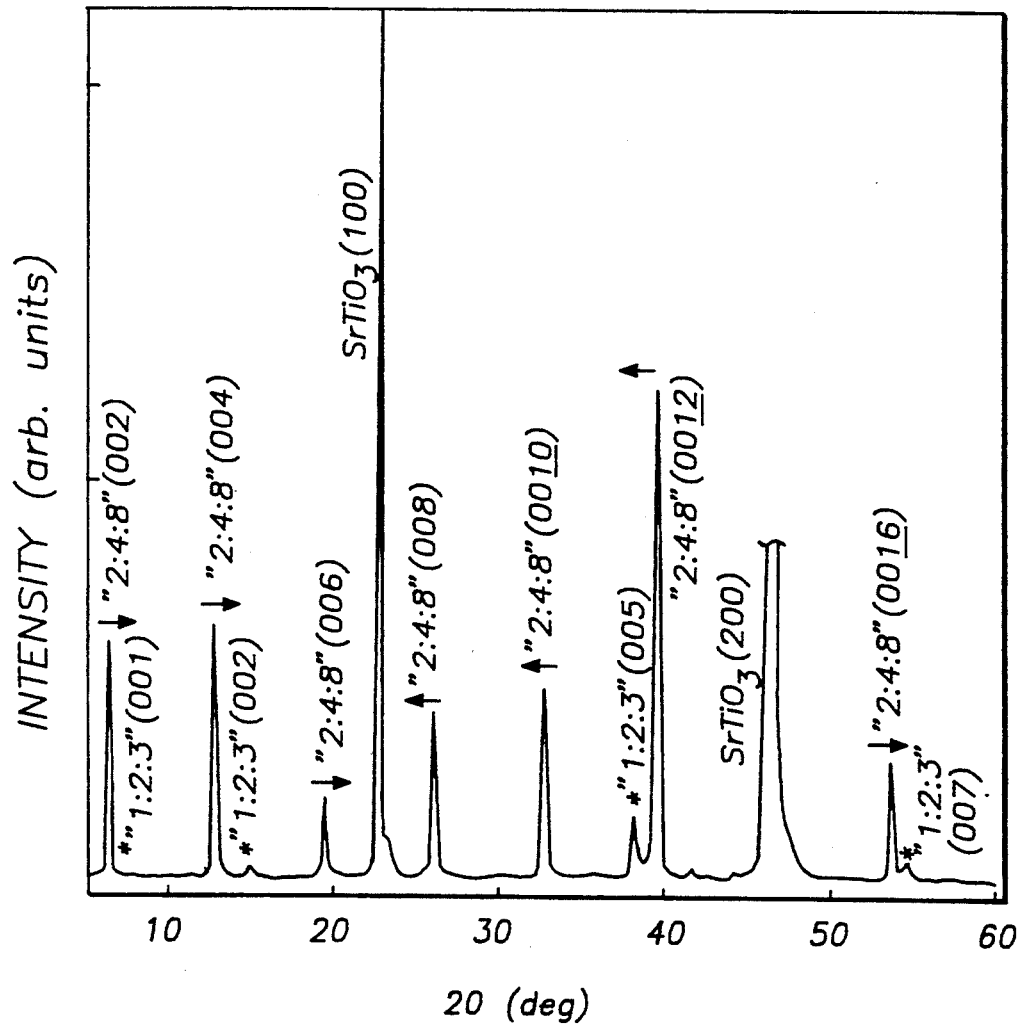
FIG.−1

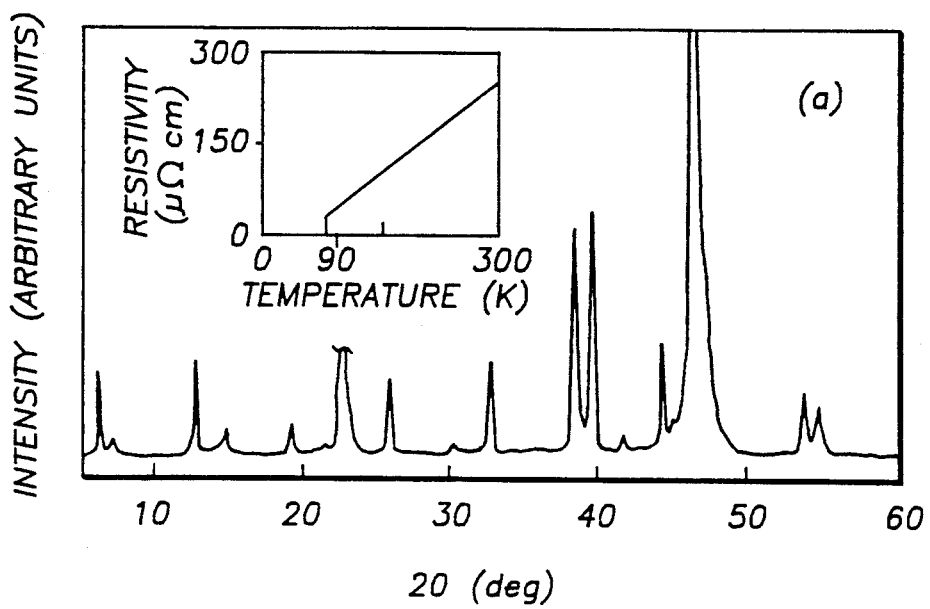
FIG.—2A
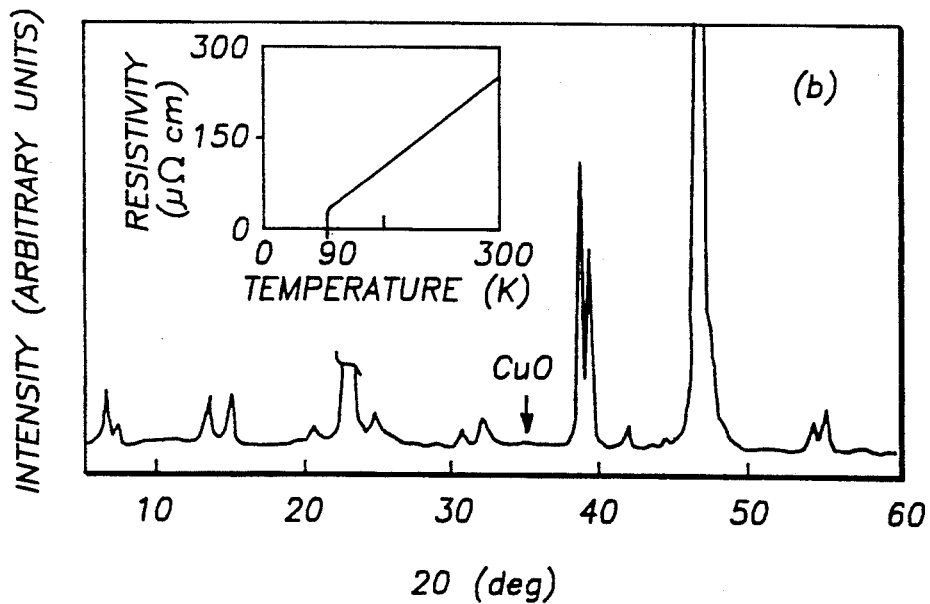
FIG.—2B

HIGH-TEMPERATURE SUPERCONDUCTORS

This invention was made with Government support under contracts DMR-861055 awarded by the National Science Foundation and F49620-88-C-0004 awarded by the United States Air Force. The Government has certain rights in this invention.

This is a continuation of application Ser. No. 07/311,627 filed on Feb. 16, 1989, now abandoned.

The present invention is directed to novel oxide compositions which exhibit high superconducting transition temperatures. The present invention is particularly directed to novel yttrium-barium-copper oxide superconducting material.

BACKGROUND OF THE INVENTION

A superconducting mixed phase yttrium-barium-copper-oxygen compound system having a superconducting transition temperature, $T_c$, was disclosed in *Physical Review Letters.* Vol. 58, 908 (Mar. 2, 1987), which has become known in the art as the 123 material short form for the formula $YBaCu_3O_{7-y}$, wherein y is in the range 0.1 to 0.5. Depending on the precise conditions utilized to make the 123 compound and upon other process condition factors, the 123 compounds exhibit a $T_c$ in the range of about 91° to 93° K. The 123 material, however, can lose oxygen from its crystal structure, particularly when subjected to heat and/or pressure. The loss of oxygen may degrade not only the superconducting properties, such as the temperature at which the material is superconductive but also, the charge carrying ability of the material, both under the superconducting conditions and under non-superconducting (metallic) conditions.

Other disadvantages of the 123 materials are that they are highly anisotropic, are poor conductors in the normal (non-superconducting) state, and contain undesirable twin planes in their lattices (a characteristic which contributes to anisotropy). Poor normal state conductivity is a limitation for use as a wire or magnet. Anisotropy may reduce critical current density, therefore very oriented, isotropic materials would be preferable, which optimally should be single crystals. The crystallographic defect of twinning causes weak links in the lattice and reduces critical current density. The 123 materials also exhibit orthorhombic distortion which is not ideal for epitaxial growth of thin films.

Furthermore, loss of oxygen from the 123 materials occurs from the CuO chains, and excessive loss degrades the superconductivity. The lability of oxygen in the 123 materials is even observed in relatively unsevere conditions (400° C. in argon or 600° C. in oxygen). High vacuum conditions would enhance oxygen loss. Oxygen deficiency would be most pronounced at the surface, which would thus be problematic for use in tunnel junction based devices.

Even when prepared in single crystal form, $T_c$'s for 123 materials have not been observed to exceed about 92° K. Materials having higher $T_c$'s would be preferable.

It is therefore an object of the present invention to provide novel oxide materials in which the oxygen atoms are locked and therefore providing more stability than the 123 compounds.

It is a further object of the present invention to provide novel superconducting compositions which have an entirely different crystal structure from the 123 materials.

It is a further object of the present invention to provide novel superconducting compositions in which single atomic layers of the 123 material appear as defects in an ordered defect structure.

It is yet another object of the present invention to provide novel mixtures of the aforementioned novel superconducting compositions with the 123 material.

These and other objects of the invention will be apparent from the following description and from the practice of the invention.

SUMMARY OF THE INVENTION

The present invention provides novel oxide superconducting compositions having an ordered defect structure along one axis. For purposes of description only, the structure of the novel oxides can be defined as stacked unit cells of the 123 material, in which there exists an ordered defect in every $n^{th}$ cell along one axis, that defect believed to be a metal-oxide plane. If this ordered defect occurs in every other so-called 123 unit cell along one axis, the novel composition will be of the general formula $R_2M_4Cu_8O_{20-x}$; and the actual unit cell is that shown in FIG. 5. A species of that formula has a superconducting transition temperature, $T_c$, of about 81° K.±2° K. and is characterized by the formula $Y_2Ba_4Cu_8O_{20-x}$, wherein x is about 3 to about 5, sometimes referred to hereinafter as the unfaulted 248 material. This material, the aforementioned $R_2M_4Cu_8O_{20-x}$, structure, is characterized by an ordered defect structure along one axis, with single atomic layer defects of a metal oxide plane oriented in planes orthogonal to that axis. In the general formula R may be the elements Y, Er, La, Ce, Pr, Nd, Pm, Sm, Em, Gd, Tb, Dy, Ho, Yb, Lu or any combination of these elements, and M may be Ba, Sr or a combination of those two elements.

If the ordered defect occurs regularly in every third, or fourth, etc. of the so-called 123 unit cells, the general formula is $(RM_2Cu_3)_nCuO_{7n+1-yn}$ wherein n is a positive integer and y varies from about 0.1 to about 0.5. Preferably, R=Y, M=Ba, and n is an integer up to and including 4.

The present invention is further directed to a second novel oxide superconducting composition which is hereinafter sometimes referred to as the faulted 248 material. The faulted 248 material, wherein R=Y and M=Ba, is characterized by a $T_c$ of 96° K.±2° K.

The invention is further directed to mixtures of either or both of the aforementioned 248 structures with the 123 material wherein the mixtures are characterized by a plurality of $T_c$ points corresponding to the respective $T_c$ temperatures of the 123 material, unfaulted 248 material and faulted 248 material, if present.

Finally, the present invention is directed to novel methods for making compositions comprising the unfaulted 248 material and faulted 248 material.

BRIEF DESCRIPTION OF THE DRAWINGS

FIG. 1 is a graph of the X-ray diffraction data of a c-axis-oriented unfaulted 248 material.

FIG. 2A shows the X-ray diffraction data of a c-axis-oriented unfaulted 248/123 mixture;

FIG. 2B is the data for a sample of the same material after high temperature annealing showing the appearance of faulted 248.

SUMMARY OF THE INVENTION

Figure 3:
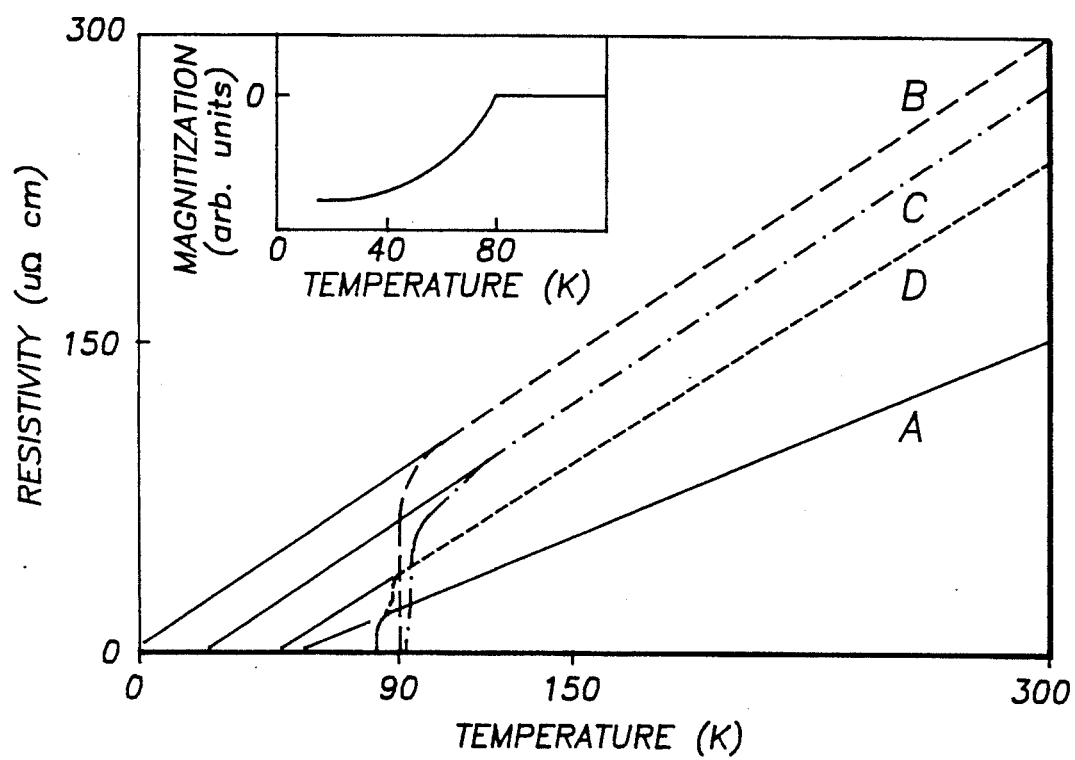
FIG. 3 is a graph of the resistivity versus temperature comparison data of c-axis-oriented unfaulted 248, c-axisoriented 123, c-axis-oriented faulted 248 and a mixture of 123 and unfaulted 248.

The present invention provides novel oxide compositions characterized by high superconducting transition temperatures. The present invention provides novel metal oxide compositions of the formula $(RM_2Cu_3)-_nCuO_{7n+1-yn}$ wherein n is a positive integer and y varies from 0.1 to about 0.5. Preferably, n is less than or equal to 4. In particular the present invention also provides an oxide composition of the formula $Y_2Ba_4Cu_8O_{20-x}$ wherein x is in the range of about 3 to about 5, which is characterized by superconducting transition temperature, $T_c$, in the range of 81° K.±2° containing an ordered defect structure stacked (unfaulted) along one axis. Another novel composition is the aforementioned composition interrupted by fault phases. The resulting faulted structure is characterized by a superconducting transition temperature of 96° K.±2°. Other novel superconducting compositions are provided which comprise mixtures of the unfaulted 248 composition and/or faulted 248 composition mixed with the 123 composition. These mixtures will have a plurality of superconducting transition temperatures corresponding to the presence of the unfaulted 248 phase, the faulted 248 phase, or a 123 phase, the last of which has a superconducting transition temperature of about 90° K.±2°. Processes of making these compositions by sputtering or evaporation are also provided.

DESCRIPTION OF THE PREFERRED EMBODIMENTS

The superconducting oxides according to the present invention may be prepared by electron-beam evaporation or by reactive magnetron sputtering as disclosed by Oh, et al., *Appl Phys. Lett.* 51, 852 (1987); Char, et al., *Appl. Phys. Lett.* 51, 1370 (1987), and Natio, et al., *J. Mater. Res.* 27, 713 (1987), the disclosures of which are incorporated by reference herein in their entirety. By controlling changes in the growth and post annealing conditions as described hereinbelow, oxides may be made either as unfaulted 248, 123, faulted 248, or mixtures thereof.

In general there are about five methods for making the ordered defect mixed metal oxides, including the 248 materials. First, the three metals (R, M and Cu) may be cosputtered onto a substrate by conventional metal sputtering methods known, for example in the semiconductor art.

Alternatively, the three metals may be coevaporated and condensed onto a substrate, again by coevaporation methods known, for example, in the semiconductor art.

Thirdly, one or more of the materials may be co-evaporated with the others as a salt. For example, 248 may be made by coevaporating yttrium metal, copper metal and $BaF_2$ onto a substrate. The three materials (i.e. the three metals) must be coformed onto the substrate in approximately the correct composition of R:M:Cu of 2:4:8, or other desired ratio according to the general formula for the ordered defect structure. The correct crystalline structure for the superconductivity may be assured by annealing the deposited metals in oxygen at a temperature in the range of about 800° to 900° C., preferably at about 850° C. The time of annealing will depend upon the thickness of the material deposited and in the usual instance for a thin film, an annealing time of around 850° C. for approximately one hour will be sufficient to convert the film entirely to the 248 structure.

In a fourth method, the superconducting structure may be obtained without post-deposition annealing by reactive evaporation during which oxygen is incorporated into the film as it grows in a vacuum chamber.

Similarly, oxygen may be incorporated into the film as it grows by reactive sputtering, such that no post-annealing may be necessary to attain the superconducting structure.

The unfaulted 248 structure (R=Y; M=Ba) is grown epitaxially with an orthorhombic unit cell (A=B=3.86, C=27.19 in which extra copper-oxygen layers create an entirely new crystal. The orthorhombic unit cell is characterized by the formula for special conditions of reflection of k+l=2n. At high concentrations the novel crystal formulation shows a distinct crystallographic phase with a unit cell parameter of 27.2. The 123 structure is sometimes also found in preparations of 248 in a mixture of c-axis 90° orientations, either normal to the substrate, or parallel to one of the crystal axes of the substrate, in the plane of the 248 film. It is known that the 123 structure is heavily twinned, causing a large amount of coincidence between the a and the b-axes. The unfaulted 248 structure however, in distinction from the 123 structure, is not twinned, and has an enhanced ability to carry current as a metal in the non-superconducting state.

The faulted 248 material may be routinely prepared by high temperature (about 850°-900° C.) annealing of the unfaulted materials in vacuum for approximately ½ to 4 hours. The X-ray diffraction data show a shift in intensity peaks which are consistent with the creation of layering disorder. The magnitude of x-ray peak shifts depend upon atomic details of the faults, and are consistent with stacked monoatomic layers having two possible interlayer distances. Such X-ray peak shifts oscillate with scattering angle and the amplitude of the shifts increase with increasing density of faults. Thus, a faulted 248 structure shows oscillatory peak shifts in the X-ray diffraction pattern as scattering angle is varied and such behavior defines the faulted 248 structure.

It is preferred that when preparing the superconducting materials by electron beam evaporation that $BaF_2$ be used as the barium source. When using reactive magnetron sputtering or electron beam evaporation, a $SrTiO_3$ target may be used. It is important, in order to obtain the novel structure of the faulted 248, that there be a rapid thermal annealing of the material within the temperature range of 800° to 900° C. for a period of time sufficient to ensure complete annealing to the faulted 248 material, usually about 1-8 hours.

Referring to the figures, FIG. 1 shows the X-ray diffraction data of an unfaulted 248 sample with the c-axis perpendicular to the substrate ($SrTiO_3(100)$). As shown in FIG. 1, each major peak is assigned to either the substrate, the c-axis-oriented 123, or c-axis-oriented phase which has a lattice parameter of 27.19 with odd-order reflections missing. Each peak of the 27.19 Å phase is sharp and falls at a scattering vector whose magnitude is an integer of the multiple $2\pi/27.19$ Å$^{-1}$ within the experimental precision of ±0.003 Å$^{-1}$. Samples which satisfy this criterion are the unfaulted structures as in contrast with the faulted structure described below. Thus, when both 123 and unfaulted 248 are present in the sample, one observes reflections from both phases. The asterisks in FIG. 1 mark pure 123 peaks.

Referring to FIG. 2 there is shown diffraction and resistivity data for (a) an unfaulted 248 sample and (b) the same sample after further annealing forming the faulted 248 structure. It is noted that after further annealing the peaks shifted, which means that the unfaulted structure is not stable at higher temperatures. While not intending to be limited to a particular theory or explanation, it is believed that the peak shifts are due to layering disorder in the structure, which belief can be at least in part supported by considering the diffraction patterns expected for layered structures with random faults. As random faults are introduced, diffraction peaks broaden and shift. The amplitude of the shifts increase with an increasing density of faults. Upon further anneal at 850° C. for one hour, a Bragg peak at $2\theta = 35.5$ appears, which is attributed to copper oxide. There is a clear change in the superconducting transition temperature associated with this structure change as shown in the inset in FIG. 2.

Referring to FIG. 3 there is shown resistivity versus temperature for the unfaulted 248 (curve A) with a 123 phase (curve B), a faulted 248 (curve C) and a 123/248 mixed but unfaulted sample (curve D) made as described in Example 1. The transition temperature of the unfaulted 248 phase is about 10° K. lower than the 91° K. normally seen in the 123 structure. Also the unfaulted 248 phase has a lower resistivity: 150 micro cm at 300° K. and 30 micro $\Omega$ cm at 100° K. compared with 300 micro cm at 300° K. and 100 micro $\Omega$ cm at 100° K. for the 123 phase. This is an advantage of the novel compositions according to the present invention in that lower resistivity, and therefore overall conductivity, as a metal allows the material to have improved heat dissipation, for example, during a charging situation. Furthermore, the resistivity of the unfaulted 248 sample extrapolates to 0 around 55° K. while the resistivity of the 123 extrapolates to 0 at about 0° K. Some samples with faulted 248 structure have been observed with onset temperatures as high as 96° K. and 0 resistance temperatures as high as 93° K. These values are repeatedly about 3-4° K. higher than those for well ordered 123 samples made under the same conditions. The unfaulted 248 and 123 phases (curve D) are mixed on a macroscopic scale clearly has one transition at 90° K. and another at 81° K., corresponding to the 123 transition and the 248 transition, respectively. In the inset shown in FIG. 3 magnetization versus temperature data is shown, obtained while heating an unfaulted 248 sample in a perpendicular field of 100 G. The sharp transition at 81° K. is in agreement with the resistivity measurement and the critical current density $J_c$ determined from a magnetic hysteresis loop is about $4 \times 10^6$ A/cm² in 3 kG at 4.2° K. and $1 \times 10^6$ A/cm² in 3 kG at 60° K. These values and the change in $T_c$, due to the 248 phase, establish further the utility of the new compositions.

Figure 4:
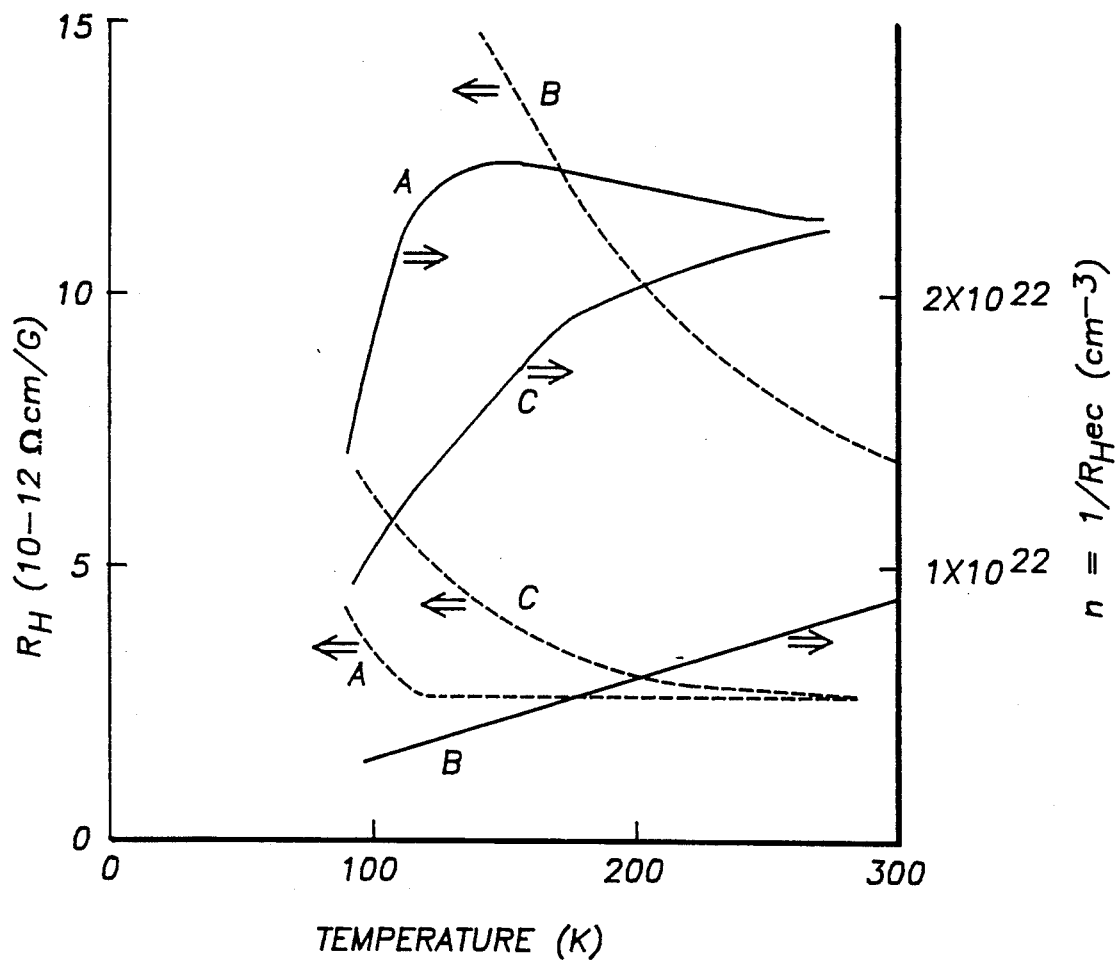
FIG. 4 shows the Hall coefficients $R_h$ and $n = 1/R_h ec$ versus temperature of a c-axis-oriented unfaulted 248 material, c-axis-oriented 123, and c-axis-oriented faulted 248.

Referring to FIG. 4 there is shown the Hall coefficient data for $R_h$ for unfaulted 248 (curve A) which is smaller than those for the 123 material (curve B), implying higher carrier density. The 123/248 mixed sample (curve C) with stacking faults has the Hall coefficient value in between those of the 123 sample and the unfaulted 248 sample. The temperature at which the inverse Hall coefficient for the unfaulted 248 phase extrapolates to 0 coincides with the temperature at which the resistivity extrapolates to 0. All samples show the hole type Hall effects.

Figure 5:
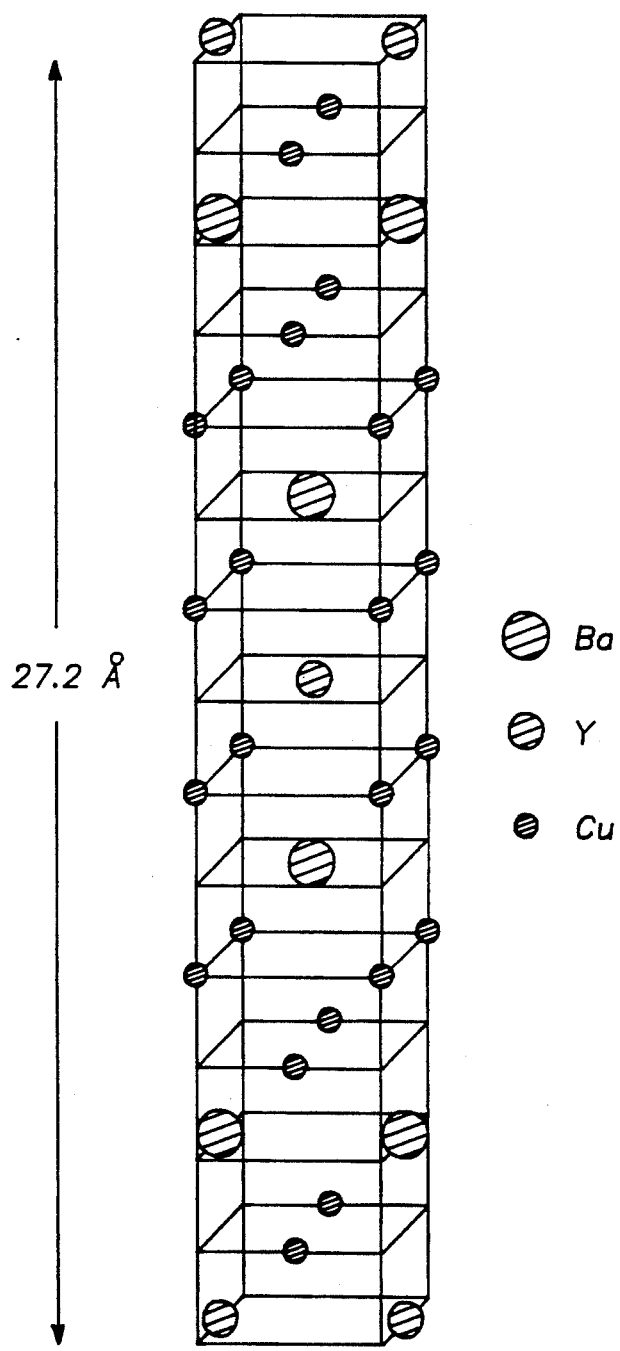
FIG. 5 shows a unit cell of the unfaulted 248 structure.

Referring to FIG. 5 there is shown an approximate crystal structure of the unfaulted 248 composition in which an extra copper-oxygen layer appears in every unit cell compared with 123 material. For clarity, oxygen atoms are not shown in FIG. 5. The extra Cu-O layer is glided by half a unit cell. The composition of this structure is $Y_2Ba_4Cu_8O_{20-x}$. In addition to the low normal state resistivities and higher carrier concentrations of this material it is believed that it is a structure in which the oxygen atoms are locked, as opposed to the parent 123 materials which can lose oxygen spontaneously, thus leading to different stacking and weakening the overall structure and superconducting properties. superconducting) state properties of the unfaulted 248 structure is around 81° K., about 10° K. lower than the parent 123 structure, this 248 structure is believed to be advantageous because it is less anisotropic than 123. This is advantageous in a superconducting material because current-carrying capacity will thus be independent of lattice orientation.

The faulted 248 structure can have a $T_c$ as high as about 96° K., higher than what is normally seen in a good 123 film, which makes it advantageous for that reason alone. As described above, the normal (non-superconducting) state properties of the unfaulted 248 phase differs significantly from those of the 123 phase, i., the 248 phase has a lower resistivity, which extrapolates to 0 at a temperature of 55° K. The Hall coefficient of the 248 phase is smaller and it has a different temperature dependence from that of the 123 phase.

Thus, the following advantageous features of the present invention include the following. Due to the low resistivity and large number of carriers that appear in the extra chain layer, there is expected to be less anisotropy in the electronic transport in the 248 structure as compared to the 123 structure. This is an excellent characteristic for high critical current applications especially when single crystals cannot be made. Also, because of the shear plane at the two Cu-O chain plains in the 248 structure the oxygen atoms should be locked, so oxygen lability should be less than in the 123 material. It is observed that oxygen lability is less, consistent with the geometry of the extra copper oxide planes, compared with the 123 material. Further, there are no twinnings in the 248 material. Because of the small orthorhombic distortion and the fact that the 248 material does not readily lose oxygen at the surface, better surfaces for electronic applications are produced as compared with the 123 material. Because of the small orthorhombic distortion, there may be better epitaxial growth of the 248 films on substrates. Finally, the high $T_c$ of the faulted 248 material is an advantage (when considering 77° K. as target temperature). Thus delta T, in terms of $T - T_c$ which (for T = 77° K.) is 13° K. for 123 material, whereas about 18° K. may be observed for faulted 248.

The following examples are presented by way of illustration, but are not intended to limit the invention in any way.

EXAMPLE 1

A thin film of $Y_2Ba_4Cu_8O_{16}$ was made as described in Marshall et al., *Phys. Rev. B*, 37(16), 9353-8 (1988), which is incorporated herein by reference in its entirety.

The resistivity data and $T_c$ of a typical 248 film, the best contemporary 123 film and a typical 123/248 mixture are shown in FIG. 3. The resistivity of unfaulted 248 (Curve A) is about 5 times smaller than that of 123 (Curve B) at their respective $T_c$'s. The $T_c$ of unfaulted 248 was measured to be 82° K., and of 123 to be 90° K. The $T_c$ of a mixture of 248/123 as high as 95° K. was observed, but had an orthorhombic distortion of b−a=0.02 Å. There was a Hall effect for unfaulted 248 indicating more carriers than in 123 by about a factor of 5.

EXAMPLE 2

Three magnetron sputtering guns holding Y, Ba and Cu targets were set up in triangular arrangement and angled to point toward the center of the substrate holder, which holds three rows of ¼ by ¼" substrates and is positioned 5 inches above the targets. This provides a composition spread in which each row has a little different copper content and the Y/Ba ratio varies across the row of substrates. SrTiO$_3${1} substrates were heated to 800° C. before deposition and cooled down to ambient temperature. Substrate temperature during deposition was about 50° C. About 2 mTorr of Ar gas was impinged upon the Y and Ba targets. The rate of each gun was measured individually by a single quartz crystal monitor located near the substrate. After the rates were set one by one, all three guns were turned on with the preset voltage and current. Then the oxygen gas of 0.1 mTorr pressure was let in near the substrate through a plurality of thin slits. The total deposition rate was about 200 Å per minute. Usual thickness of the films were about 2000 Å. Films with slightly Y-rich and definite Cu-rich composition ($Y_{15}Ba_{29}Cu_{56}O_x$) compared with 123 have extra X-ray peaks at $2\theta \approx 6.5°$, 13.1°, 19.7°, 26.3°, 32.8°, 39.5° and 54.0°. These peaks were identified as belonging to the 27.2 Å structure $Y_2Ba_4Cu_8O_{20-x}$.

EXAMPLE 3

Sources of Y, Cu and BaF$_2$ (or Ba) were put in a water-cooled copper hearth in a triangular array to achieve a composition spread as described above for the sputtering technique described in Example 2. SrTiO$_3${100} substrates were heated up to 800° C. before deposition and cooled down to ambient temperature. Substrate temperature during deposition was about 50° C. Each source was evaporated by means of an electron beam and the rates were again individually calibrated by three quartz crystal monitors. ERM (evaporation rate monitor) parameters were set for the rate and during an actual growth these ERM parameters were maintained by feedback circuits. Oxygen gas of about $2 \times 10^{-6}$ Torr pressure was disposed from a tube close to substrates. The total deposition rate was about 10 Å per second. Thickness of the films were between 2000 Å and 4000 Å. Following the deposition, films made with Ba metal were annealed in the flowing oxygen at 850° C. for 1 hour and cooled down about 5° C. per minute. Films made with BaF$_2$ were annealed in the flowing oxygen passed through a water bubbler, at 850° C. for 1 hour; the temperature was then ramped down by 5° C. per minute speed with dry oxygen gas flowing. Films having extra X-ray peaks at $2\theta \approx 6.5°$, 13.1°, 19.7°, 26.3°, 32.8°, 39.5° and 54.0° are those having the $Y_2Ba_4Cu_8O_{20-x}$, structure.

It is contemplated that many modifications may be made by those of ordinary skill in the art by reading the above disclosure and by practicing the invention, which modifications are intended to be within the scope of the present invention. Such modifications include the substitution of yttrium by lanthanum, cerium, praseodymium, neodymium, promethium, europium, samarium, gadolinium, terbium, dysprosium, holmium, erbium, ytterbium, lutetium or a combination of the foregoing. Furthermore it will be recognized that the barium may be substituted for by strontium or a combination of barium and strontium.

What is claimed is:

1. A crystallographic phase characterized by an ordered defect structure stacked along one axis, said structure comprising a first phase oriented in planes orthogonal to said axis, and fault planes in said first phase orthogonal to said axis and stacked along said axis, said structure having the composition $R_2M_4Cu_8O_{20-x}$ wherein x is in the range of about 3 to about 5, R is selected from the group consisting of Y, Er, La, Ce, Pr, Nd, Pm, Sm, Eu, Gd, Tb, Dy, Ho, Yb, Lu and combinations thereof; and M is selected from the group consisting of Ba, Sr and combinations thereof.

2. A crystallographic phase according to claim 1 of the formula $Y_2Ba_4Cu_8O_{20-x}$ characterized by a superconducting transition temperature, $T_c$, of about 81° K.=2° K.

3. A crystallographic phase of the formula $R_2M_rCu_8O_{20-x}$, wherein x is in the range of about 3 to about 5, R is selected from the group consisting of Y, Er, La, Ce, Pr, Nd, Pm, Sm, Eu, Gd, Tb, Dy, Ho, Yb, Lu and combinations thereof; and M is selected from the group consisting of Ba, Sr and combinations thereof, said structure characterized by oscillatory peak shifts in X-ray diffraction patterns as scattering angle is varied.

4. A crystallographic phase according to claim 3 of the formula $Y_2Ba_4Cu_8O_{20-x}$ characterized by a superconducting transition temperature, $T_c$, of about 81° K.±2°.

5. A mixture consisting essentially of a first crystallographic oxide phase according to claim 2, and a second crystallographic oxide phase of the formula $YBa_2Cu_3O_{7-y}$ wherein y is in the range of about 0.1 to about 0.5, said mixture characterized by a first superconducting transition temperature, $T_{c1}$, of 81° K.±2° and a second superconducting transition temperature, $T_{c2}$, of 90° K.±2°.

6. A mixture consisting essentially of a first crystallographic oxide phase according to claim 2, and a second crystallographic oxide phase of the formula $YBa_2Cu_3O_{7-y}$ wherein y is in the range of about 0.1 to about 0.5, said mixture characterized by a first superconducting transition temperature, $T_{c1}$, of about 90° K.±2° and a second superconducting transition temperature, $T_{c2}$, of about 96° K.±2°.

7. A mixture consisting essentially of a first crystallographic oxide phase according to claim 2, and a second crystallographic oxide phase of the formula $R_2M_4Cu_iO_{20-x}$ wherein x is in the range of about 3 to about 5, R is selected from the group consisting of Y, Er, La, Ce, Pr, Nd, Pm, Sm, Eu, Gd, Tb, Dy, Ho, Yb Lu and combinations thereof; and M is selected from the group consisting of Ba, Sr and combinations thereof, said second composition characterized by oscillatory peak shifts in X-ray diffraction patterns as scattering angle is varied; said mixture characterized by a first superconducting transition temperature, $T_{c1}$, of about 81° K±2° and a second superconducting transition temperature, $T_{c2}$, of about 96° K.±2°.

8. A mixture consisting essentially of a first crystallographic oxide phase according to claim 2, a second crystallographic oxide phase of the formula $Y_2Ba_4Cu_8O_{20-x}$ characterized by a superconducting transition temperature, $T_c$, of about 96° K.+2; and a third crystallographic oxide phase of the formula $YBa_2Cu_3O_{7-y}$, wherein y is in the range of about 0.1 to about 0.5, said mixture characterized by three superconducting transition temperatures, $T_{c1}$ of about 81° K.±2° K., $T_{c2}$ of about 90° K.±2°, and $T_{3c}$ of about 96° K.±2°.

9. A method for conducting an electrical current within a conductor material without electrical resistive losses, comprising the steps of:
 cooling a conductor material comprising a crystallographic metal oxide phase of the formula $R_2M_4Cu_8O_{20-x}$ wherein x is in the range of about 3 to about 5; R is selected from the group consisting of Y, Er, La, Ce, Pr, Nd, Pm, Sm, Eu, Gd, Tb, Dy, Ho, Yb, Lu and combinations thereof; and M is selected from the group consisting of Ba, Sr and combinations thereof; to a temperature at which said metal oxide is superconductive; and
 flowing electrical current within said metal oxide while maintaining said metal oxide at a temperature at which it is superconductive.

10. A method according to claim 9 wherein said conductor material comprises a crystallographic metal oxide phase of the formula $Y_2Ba_4Cu_8O_{20-x}$ and said conductor material is characterized by at least one superconducting transition temperature, $T_c$, of about 81° K.±2° K.

11. A method according to claim 9 wherein said crystallographic metal oxide phase is of the formula $Y_2Ba_4Cu_8O_{20-x}$ and said conductor material is characterized by at least one superconducting transition temperature, $T_c$, of about 96° K.±2°.

12. A method according to claim 10 wherein said conductor material is further characterized by a second superconducting transition temperature, $T_{c2}$, of 90° K.±2°.

13. A method according to claim 11 wherein said conductor material is further characterized by a second superconducting transition temperature, $T_{c2}$, of about 90° K.±2°.

14. A method according to claim 10 wherein said conductor material is further characterized by a second superconducting transition temperature, $T_{c2}$, of about 90° K.±2°.

15. A method according to claim 10 wherein said conductor material is further characterized by a third superconducting transition temperature, $T_{c3}$ or about 90° K.±2°.

16. A crystallographic metal oxide phase characterized by at least one superconductive critical temperature, $T_c$, having the formula $R_2M_4Cu_8O_{20-x}$ wherein x is in the range of from about 3 to about 5; R is selected from the group consisting of Y, Er, La, Ce, Pr, Nd, Pm, Sm, Eu, Gd, Tb, Dy, Ho, Yb, Lu and combinations thereof; and M is selected from the group consisting of Ba, Sr and combinations thereof; said phase made by the process comprising the steps of:
 sputtering the metals R, M and Cu as a mixture onto a substrate in proportions appropriate to yield said formula;
 heating said mixture at 800°–900° C. for a period of time to anneal said mixture to said composition.

17. A crystallographic metal oxide phase according to claim 16 wherein R is Y and M is Ba.

18. A crystallographic metal oxide phase according to claim 17 wherein said $T_c$ is at 81° K.±2° K.

19. A crystallographic metal oxide phase according to claim 17 wherein said $T_c$ is 96° K.±2° K.

20. A crystallographic metal oxide phase according to claim 17 having two $T_c$'s at 90° K.±2° K. and at 81° K.±2° K.

21. A crystallographic metal oxide phase according to claim 17 having two $T_c$'s at 90° K.±90° K. and at 96° K.±2° K.

22. A crystallographic metal oxide phase according to claim 17 having two $T_c$'s at 81° K.±2° K. and at 96° K.±2° K.

23. A crystallographic metal oxide phase according to claim 17 having three $T_c$'s at 81° K.±2° K. and 96° K.±2° K.

24. A crystallographic metal oxide phase characterized by at least one superconductive critical temperature, $T_c$, having the formula $R_2M_4Cu_8O_{20-x}$ wherein x is in the range of from about 3 to about 5; R is selected from the group consisting of Y, Er, La, Ce, Pr, Nd, Pm, Sm, Eu, Gd, Tb, Dy, Ho, Yb, Lu and combinations thereof; and M is selected from the group consisting of Ba, Sr and combinations thereof; said phase made by the process comprising the steps of:
 co-evaporating the metals A, M and Cu as a mixture onto a substrate in proportions appropriate to yield said formula;
 heating said mixture at 800°–900° C. for a period of time to anneal said mixture to said composition.

25. A crystallographic metal oxide phase according to claim 24 wherein R=Y and M=Ba.

26. A crystallographic metal oxide phase characterized by at least one superconductive critical temperature, $T_c$, having the formula $R_2M_4Cu_8O_{20-x}$ wherein x is in the range of from about 3 to about 5; A is selected from the group consisting of Y, Er, La, Ce, Pr, Nd, Pm, Sm, Eu, Gd, Tb, Dy, Ho, Yb, Lu and combinations thereof; and M is selected from the group consisting of Ba, Sr and combinations thereof; said phase made by the process comprising the steps of:
 co-evaporating the metals A or a salt thereof, M or a salt thereof, and Cu or a salt thereof as a mixture onto a substrate in proportions appropriate to yield said formula;
 heating said mixture at 800°–900° C. for a period of time to anneal said mixture to said composition.

27. A crystallographic metal oxide phase according to claim 26 wherein metal y, metal Cu and salt $BaF_2$ are co-evaporated as a mixture onto said substrate.

28. A crystallographic metal oxide phase according to claim 26 wherein R is Y and M is Ba.

29. A crystallographic metal oxide phase according to claim 25 or 28 wherein said $T_c$ is at 81° K.±2° K.

30. A crystallographic metal oxide phase according to claim 25 or 28 wherein said $T_c$ is 96° K.±2° K.

31. A crystallographic metal oxide phase according to claim 25 or 28 having two $T_c$'s at 90° K.±2° K. and at 81° K.±2° K.

32. A crystallographic metal oxide phase according to claim 25 or 28 having two $T_c$'s at 90° K.±2° K. and at 96° K.±2° K.

33. A crystallographic metal oxide phase according to claim 25 or 28 having two $T_c$'s at 81° K.±2° K. and at 96° K.±2° K.

34. A crystallographic metal oxide phase according to claim 25 or 28 having three $T_c$'s at 81° K.±2° K. and at 96° K.±2° K.

35. A crystallographic metal oxide phase characterized by at least one superconductive critical temperature, $T_c$, having the formula $R_2M_4Cu_8O_{20-x}$ wherein x is in the range of from about 3 to about 5; R is selected from the group consisting of Y, Er, La, Ce, Pr, Nd, Pm, Sm, Eu, Gd, Tb, Dy, Ho, Yb, Lu and combinations thereof; and M is selected from the group consisting of Ba, Sr and combinations thereof; said composition made by the process comprising the step of:
 sputtering in the presence of oxygen the metals R, M and Cu as a mixture onto a substrate in proportions appropriate to yield said formula.

36. A crystallographic metal oxide phase according to claim 35 wherein R is Y and M is Ba.

37. A crystallographic metal oxide phase characterized by at least one superconductive critical temperature, $T_c$, having the formula $R_2M_4Cu_8O_{20-x}$ wherein x is in the range of from about 3 to about 5; A is selected from the group consisting of Y, Er, La, Ce, Pr, Nd, Pm, Sm, Eu, Gd, Tb, by, Ho, Yb, Lu and combinations thereof; and M is selected from the group consisting of Ba, Sr and combinations thereof; said phase made by the process comprising the step of:
 co-evaporating in the presence of oxygen the metals R, M and Cu as a mixture onto a substrate in proportions appropriate to yield said formula.

38. A crystallographic metal oxide phase according to claim 37 wherein R=Y and M=Ba.

39. A crystallographic metal oxide phase characterized by at least one superconductive critical temperature, $T_c$, having the formula $R_2M_4Cu_8O_{20-x}$ wherein x is in the range of from about 3 about 5; A is selected from the group consisting of Y, Er, La, Ce, Pr, Nd, Pm, Sm, Eu, Gd, Tb, by, Ho, Yb, Lu and combinations thereof; and M is selected from the group consisting of Ba, Sr and combinations thereof; said composition made by the process comprising the step of:
 co-evaporating in the presence of oxygen the metals R or a slat thereof, M or a salt thereof, and Cu or a salt thereof as a mixture onto a substrate in proportions appropriate to yield said formula.

40. A crystallographic metal oxide phase according to claim 39 wherein metal Y, metal Cu and salt $BaF_2$ are co-evaporated as a mixture onto said substrate.

41. A crystallographic metal oxide phase according to claim 39 wherein R is Y and M is Ba.

42. A crystallographic metal oxide phase according to claim 36, 40 or 41 wherein said $T_c$ is at 81° K.±2° K.

43. A crystallographic metal oxide phase according to claim 36, 40 or 41 wherein said $T_c$ is 96° K.±2° K.

44. A crystallographic metal oxide phase according to claim 36, 40 or 41 having two $T_c$'s at 90° K.±2° K. and at 81° K.±2° K.

45. A crystallographic metal oxide phase according to claim 36, 40 or 41 having two $T_c$'s at 90° K.±2° K. and at 96° K.±2° K.

46. A crystallographic metal oxide phase according to claim 36, 38 or 41 having two $T_c$'s at 81° K.±2° K. and 96° K.±2° K.

47. A crystallographic metal oxide phase according to claim 35, 38 or 41 having three $T_c$'s at 81° K.±2° K.m 90° K.±2° K. and 96° K.±2° K.

48. A crystallographic phase characterized by an ordered defect structure stacked along one axis, said structure comprising a major phase oriented in planes orthogonal to said axis, and fault planes in said phase orthogonal to said axis and stacked along said axis, said structure having the formula $(RM_2Cu_3)^nCuO_{7n+1-yn}$ wherein n is a positive integer and y is in the range of 0.1 to 0.5, R is selected from the group consisting of y, Er, La, Ce, Pr, Nd, Pm, Sm, Eu, Gd, Tb, Dy, Ho, Yb, Lu and combinations thereof; and M is selected from the group consisting of Ba, Sr and combinations thereof.

49. A crystallographic phase according to claim 48 wherein R is Y, M is Ba, and n is an integer up to and including 4.

* * * * *